(12) United States Patent
Murata

(10) Patent No.: US 7,183,763 B1
(45) Date of Patent: Feb. 27, 2007

(54) PROBE CARD

(75) Inventor: Hisanori Murata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/374,023

(22) Filed: Mar. 14, 2006

(30) Foreign Application Priority Data

Nov. 30, 2005 (JP) ............................. 2005-346124

(51) Int. Cl.
*G01R 33/12* (2006.01)
(52) U.S. Cl. .................................................. 324/212

(58) Field of Classification Search ................ 324/212
See application file for complete search history.

(56) References Cited

FOREIGN PATENT DOCUMENTS

JP 11-237368 8/1999

*Primary Examiner*—Reena Aurora
(74) *Attorney, Agent, or Firm*—Staas & Halsey LLP

(57) ABSTRACT

A probe card includes a base that supports a probe pin and an electromagnet. When the probe pin contacts a magnetic-sensor terminal in on a chip on a wafer, magnetic force is applied to a magnetic-field sensing section in the chips.

3 Claims, 5 Drawing Sheets ation of a test
PROBE CARD

BACKGROUND OF THE INVENTION

1. Field of the Invention

The present invention relates to a probe card that senses the output of a magnetic sensor in a chip.

2. Description of the Prior Art

To date, a technique has been known in which a test on a test subject is carried out, by utilizing magnetic force (e.g., refer to Japanese Patent Application Laid-Open No. 11-237368).

Meanwhile, a semiconductor device equipped with a magnetic sensor is known. In the magnetic sensor, a magnetic-field sensing section that receives magnetic force and creates an output in accordance with the magnetic force, and a magnetic-sensor terminal for externally sensing the output created in the magnetic-field sensing section are provided. In a fabrication process for a semiconductor device equipped with a magnetic sensor, a test apparatus is utilized with which, being kept mounted on a wafer, the magnetic sensor incorporated in a chip on the wafer undergoes a test on its characteristics. In the test apparatus, by testing characteristics of a magnetic sensor, whether or not the quality of a chip is good is determined.

FIG. 5 is a view illustrating the configuration of a test apparatus, as an example of a conventional apparatus, with which characteristics of a magnetic sensor on a semiconductor device are tested.

In a test apparatus 50, a prober 51 is provided with which, before being cut as a chip, a semiconductor device is tested in the state of a wafer.

In the prober 51, a wafer platform 52 is provided; a wafer 53 is placed on a given position of the wafer platform 52. The wafer platform 52 is driven in X, Y, or Z direction by a driving device (unillustrated).

In addition, in the prober 51, a probe card 54 is provided that has probe pins 55 for contacting respective magnetic-sensor terminals (unillustrated) of subject chips and sensing respective outputs that are outputted at the magnetic-sensor terminals. Above the probe card 54, a magnetic-field generation device 60 is provided that applies magnetic force to a magnetic-field sensing section (unillustrated) on a chip. An electromagnet 63 is formed of an iron core 61 and a coil 62 wound around the iron core 61; an electromagnet-driving power source 64 is turned on, and a current flows in the coil 62, whereby the electromagnet 63 creates a magnetic field. The magnetic field leaks through the gap of the electromagnet 63; the leakage magnetic field is applied to the magnetic-field sensing section (unillustrated) on the chip. When the magnetic field is applied to the magnetic-field sensing section on the chip, the output of the magnetic-field sensing section varies in accordance with the magnetic force. Thus, the probe pin 55 contacts the magnetic-sensor terminal that is electrically connected to the magnetic-field sensing section, thereby sensing the output that is outputted at the magnetic-sensor terminal. A measurement section 65 measures, through a conducting wire 66, the output at the magnetic-sensor terminal, that has been sensed by the probe pin 55, and determines whether or not the chip quality is good, based on the result of the measurement.

In the conventional test apparatus 50, in order to, with the front-end positions of the probe pins 55 being regarded as reference, adjust the distance between the front-end positions of the probe pins 55 and the gap section of the electromagnet 63, a positioning mechanism (unillustrated) is provided with which the electromagnet 63 is moved vertically.

Moreover, in the conventional test apparatus 50, a large-size electromagnet is provided so that the magnetic field is widely created; however, due to the restriction that the electromagnet is arranged outside the prober 51, the distance between the front-end positions of the probe pins 55 and the gap section of the electromagnet is elongated, whereby it has been a problem that desired magnetic force may not be obtained.

Still moreover, use of a large-size electromagnet has an advantage in that, by widening the gap section of the electromagnet, the magnetic field can widely be homogenized; however, in some cases, it is required to apply the magnetic field locally to the magnetic-field sensing section of the magnetic sensor. Furthermore, in the case where an electromagnet that creates a high magnetic field is utilized, the increase of the frequency of the drive current results in large attenuation, due to the high inductance of the coil; because, in order to compensate the attenuation, a voltage is required to exceed several hundred volts, a commercially available power source cannot be utilized, thereby causing a problem of high cost.

SUMMARY OF THE INVENTION

The present invention has been made in view of the above circumstances and provides a probe card in which cost reduction is realized, and contrivance of accurately applying to the magnetic-field sensing section a local magnetic field or a high-frequency magnetic field is employed.

A probe card according to the present invention includes a probe pin that is utilized fixed in a test apparatus for testing characteristics of a magnetic sensor in each of chips arranged on a wafer, each magnetic sensor, which has a magnetic-field sensing section that receives magnetic force and creates an output corresponding to the magnetic force and a magnetic-sensor terminal that enables external sensing of the output created in the magnetic-field sensing section, being formed in the chip, contacts the magnetic-sensor terminal in each chip, and senses the output outputted to the magnetic-sensor terminal; the probe card includes: a base that supports the probe pin; and an electromagnet that, when the probe pin supported by the base contacts the magnetic-sensor terminal in one of the chips on the wafer, applies magnetic force to the magnetic-field sensing section in the one of the chips.

In the present invention, by utilizing a configuration in which the electromagnet and the probe pins are provided in the base, it is not necessary to arrange an electromagnet above the probe card; therefore, it is not required to adjust the position of the gap section of the electromagnet.

Moreover, in the present invention, compared with conventional examples, the distance between the magnetic-field sensing section and the electromagnet becomes extremely short; accordingly, the electric power for applying the magnetic field can be suppressed to a low level. Still moreover, downsizing of the electromagnet reduces material costs, whereby reduction of the capacity of the driving power source can suppress purchasing cost for the power source.

Still moreover, in the present invention, it is possible to accurately apply a local magnetic field to the magnetic sensor. Because, even in the case where an electromagnet that creates a high magnetic field is utilized, the inductance of the coil can be suppressed to a low value, a power source for a high voltage, e.g., several hundred volts, is not required; therefore, a commercially available power source can be utilized.

Furthermore, to date, a test, on the characteristics of the magnetic sensor, in which a magnetic-field frequency of approximately 100 Hz is utilized has been implemented; however, a test/evaluation utilizing a frequency of up to MHz is enabled.

In this situation, in the probe card according to the present invention, it is preferable that the electromagnet is vertically movably supported by the base so that, when the probe pin comes in contact with the magnetic-sensor terminal, the electromagnet is raised by the wafer, while being in a condition of adjoining the wafer.

By employing a configuration in which the electromagnet is vertically movably supported by the base, even in the case where the wear of the probe pins, or the like, occurs, the distance between the gap section of the electromagnet and the magnetic-field sensing section is always constant, whereby the intensity of the magnetic field is also kept constant.

As explained heretofore, the present invention can provides a probe card in which cost reduction is realized, and contrivance of accurately applying to the magnetic-field sensing section a local magnetic field or a high-frequency magnetic field is employed.

BRIEF DESCRIPTION OF THE DRAWINGS

Parts (a) through (d) of FIG. 4 are sectional views for explaining the supporting mechanism of the supporting section of a probe card as the second embodiment of the present invention.

DETAILED DESCRIPTION OF THE PREFERRED EMBODIMENTS

Embodiments of the present invention will be explained below.

Figure 1:
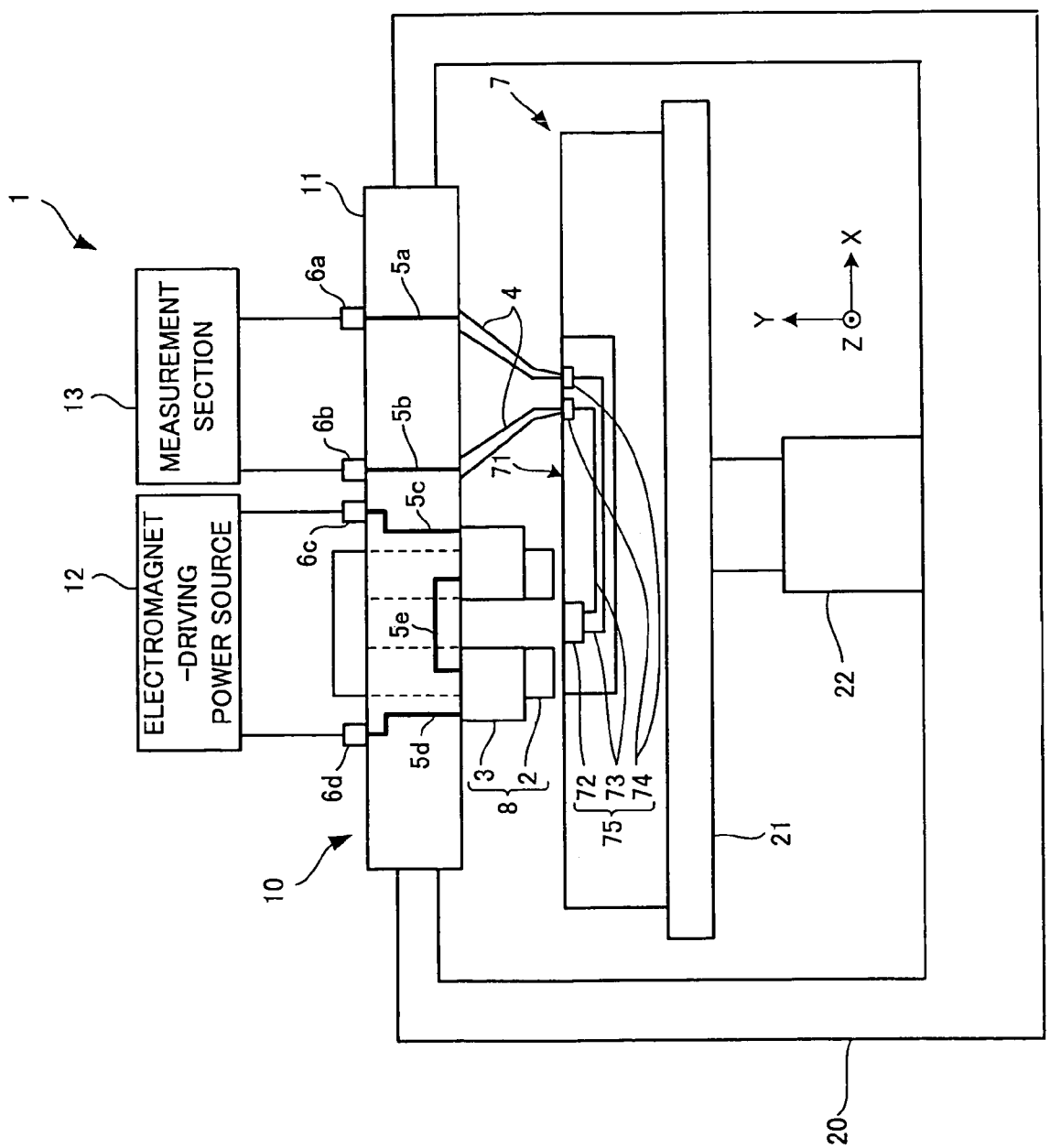
FIG. 1 is a sectional view illustrating the configuration of a test apparatus in which a probe card as a first embodiment of the present invention is employed.

FIG. 1 is a sectional view illustrating the configuration of a test apparatus in which a probe card as the first embodiment of the present invention is employed.

As illustrated in FIG. 1, a prober 20 is provided in a test apparatus 1.

The prober 20 is to test the characteristics of a magnetic sensor 75 in a chip 71 formed on a wafer 7.

In the prober 20, a driving device 22 is provided with which the wafer 7 is placed on a wafer platform 21 and moved in three axial directions, and arbitrary chips are moved to the test position.

On the wafer 7, a great number of chips 71 are provided; the magnetic sensor 75 is provided in each of the chips 71.

The magnetic sensor 75 has a magnetic-field sensing section 72, magnetic-sensor terminals 74, and electric conductive wires 73.

In addition, for a clearer understanding of the explanation, on the wafer 7, a single chip 71 is illustrated; however, as described above, on the wafer 7, a great number of chips are formed.

The magnetic-field sensing section 72 is to sense an output that varies in accordance with a magnetic field. The magnetic-sensor terminals 74 are electrically connected through the electric conductive wires 73 to the magnetic-field sensing section 72 and make the output obtained through the magnetic-field sensing section 72 to be externally sensed.

On the prober 20, a probe card 10 is mounted that is the first embodiment of the present invention.

In the probe card 10, a base 11 is provided that supports probe pins 4 and electromagnet 8. The base 11 is to support the probe pins 4 immediately above the magnetic-sensor terminals 74 that travel to the test position. The probe pins 4 sequentially contact the magnetic-sensor terminals 74 of each chip that sequentially travels to the test position, and sense the outputs that are outputted at the magnetic-sensor terminals 74.

In and on the probe card 10, conductive wires 5a and 5b, and terminals 6a and 6b are provided, respectively, for leading to a measurement section 13 the outputs that are outputted at the magnetic-sensor terminals 74 and sensed through the probe pins 4.

Additionally, in the probe card 10, the electromagnet 8 is provided that applies magnetic force to the magnetic-field sensing section 72; the electromagnet 8 is supported by the base 11. The electromagnet 8 is formed of an iron core 2 and a coil 3 wound around the iron core 2; the electromagnet 8 is situated in such a way that, when the probe pins 4 contact the magnetic-sensor terminals 74 in a chip on the wafer 7, the electromagnet 8 is positioned in the magnetic-field sensing section 72 in the same chip.

In the probe card 10, terminals 6c and 6d, and conductive wires 5c, 5d, and 5e are provided. The terminals 6c and 6d, the conductive wires 5c, 5d, and 5e are to lead a current to the coil 3.

In addition, an electromagnet-driving power source 12 is provided in the test apparatus 1. The electromagnet-driving power source 12 is a power source for exciting the electromagnet 8.

Additionally, the measurement section 13 is provided in the test apparatus 1. The measurement section 13 measures through the probe pins 4 currents and voltages as the electric characteristics of the magnetic sensor 75, and determines whether or not the chip quality is good.

Next, the operation of the first embodiment, illustrated in FIG. 1, of the present invention will be explained.

In the first place, the prober 20 moves, through the driving device 22, the arbitrary chip 71 formed on the wafer 7 placed on the wafer platform 21, to the test position. The prober 20 detects the probe pin 4, through an unillustrated sensor, and raises through the driving device 22 the wafer 7 in such a way that the magnetic-sensor terminals 74 contact the probe pins 4 electrically.

As illustrated in FIG. 1, the magnetic-sensor terminals 74 contact the probe pins 4 of the probe card 10 electrically, and the electromagnet 8 applies a magnetic field to the magnetic-field sensing section 72. In the magnetic-field sensing section 72, electromotive force is created, whereby the output current flows through the conducting wires 73 and is sensed through the probe pins 4.

Figure 2:
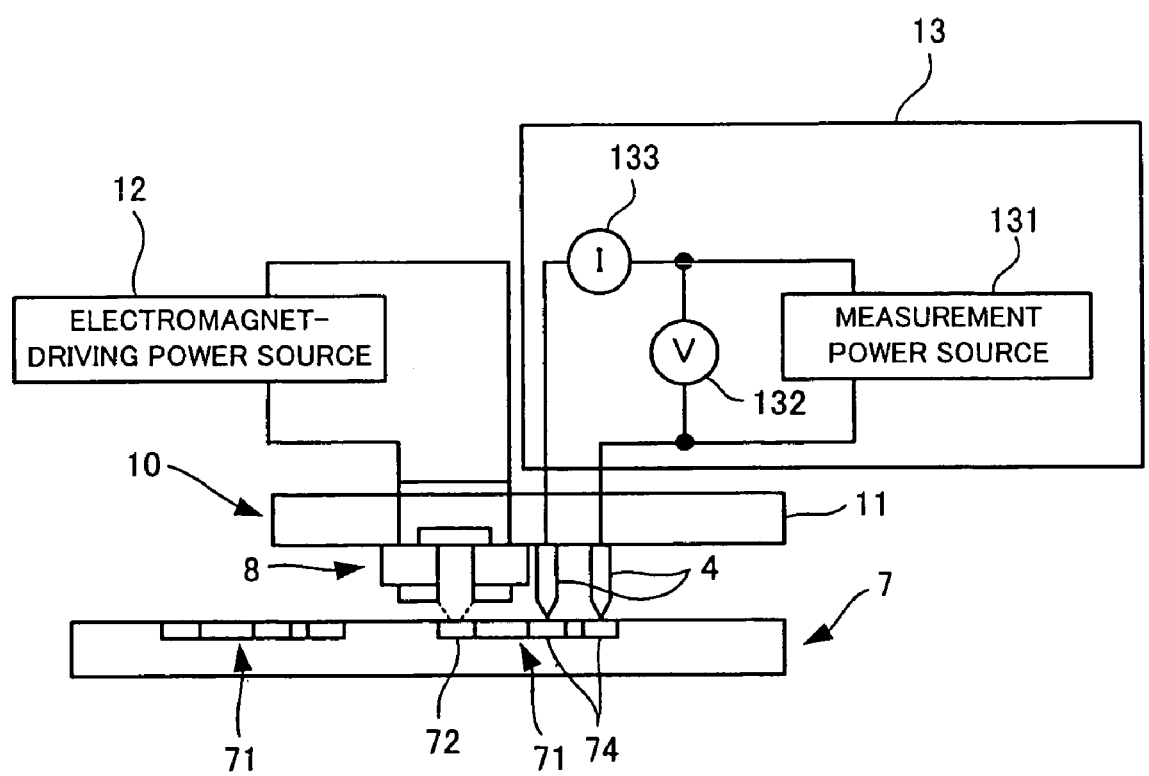
FIG. 2 is a schematic view for explaining the processing of a measurement section in which a probe card as first embodiment of the present invention is employed.

FIG. 2 is a schematic view for explaining the processing of a measurement section in which the probe card as the first embodiment of the present invention is employed.

In the measurement section 13, a measurement power source 131, a voltmeter 132, and an ampere meter 133 are provided.

The electromotive force in the magnetic-field sensing section 72 is measured through the voltmeter 132, and the output current from the magnetic-field sensing section 72 is measured through the ampere meter 133.

In the measurement section 13, whether the quality of the chip 71 is good is determined, based on the results of the measurement through the voltmeter 132 and the ampere meter 133.

As described above, by utilizing a configuration in which the electromagnet 8 and the probe pins 4 are provided in the base 11, it is not necessary to arrange an electromagnet above the probe card 10; therefore, it is not required to adjust the distance between the front-end positions of the probe pins and the gap section of the electromagnet.

In addition, compared with conventional examples, the distance between the magnetic-field sensing section 72 and the electromagnet 8 becomes extremely short; accordingly, the electric power for applying the magnetic field can be suppressed to a low level. Downsizing of the electromagnet reduces material costs, whereby reduction of the capacity of the driving power source can suppress purchasing cost for the power source.

Moreover, it is possible to accurately apply a local magnetic field to the magnetic sensor 75 (see FIG. 1), whereby the inductance of the coil can be suppressed to a low value, even in the case where an electromagnet that creates a high magnetic field is utilized; therefore, a power source for a high voltage, e.g., several hundred volts, is not required, and a commercially available power source can be utilized. Still moreover, to date, a test, on the characteristics of the magnetic sensor, in which a magnetic-field frequency of approximately 100 Hz is utilized has been implemented; however, a test/evaluation utilizing a frequency of up to MHz is enabled.

This concludes the explanation for the first embodiment of the present invention; next, the second embodiment of the present invention will be explained.

The second embodiment of the present invention has an approximately the same configuration as that of the first embodiment of the present invention, except for part of the inner configuration; therefore, what differs will be explained.

Figure 3:
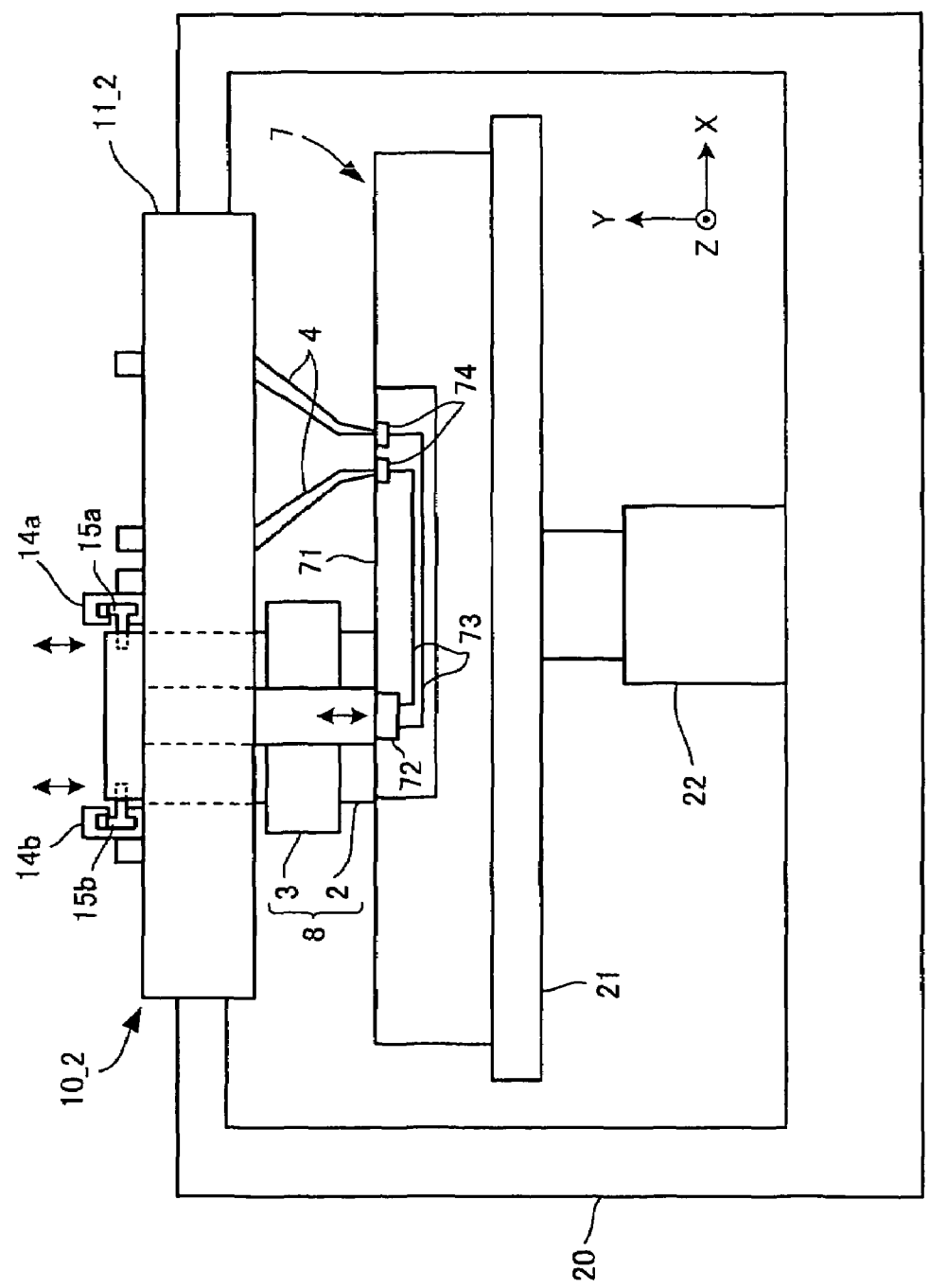
FIG. 3 is a sectional view illustrating the configuration of a test apparatus in which a probe card as a second embodiment of the present invention is employed.
Figure 4A:
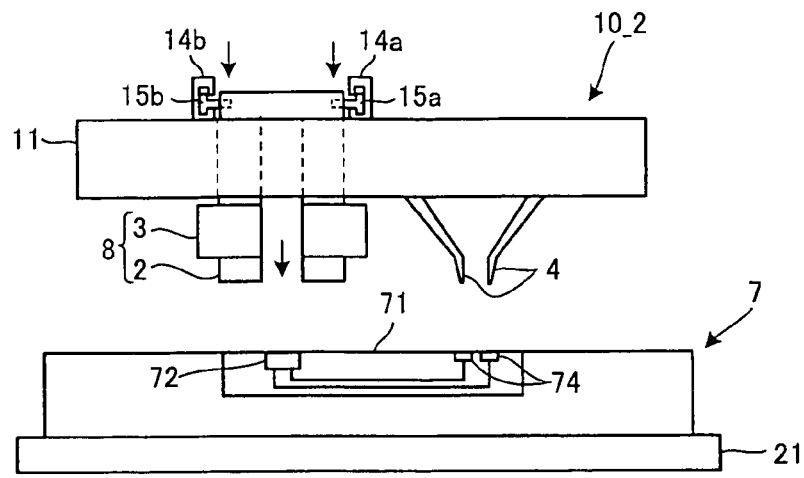
Figure 4B:
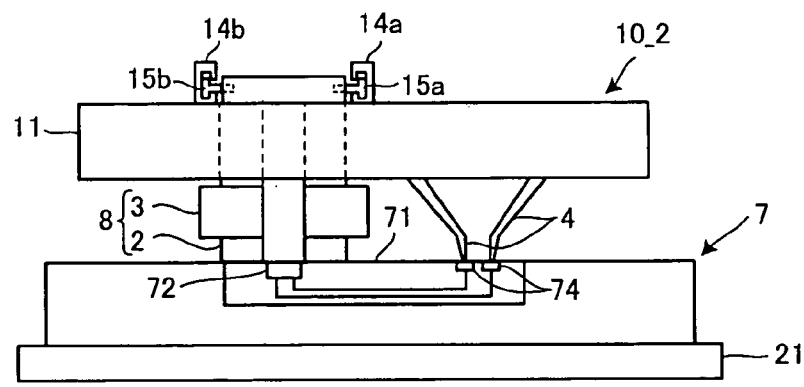
Figure 4C:
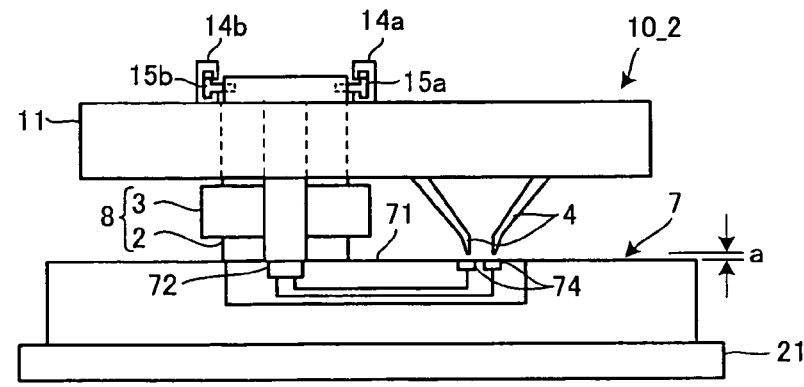
Figure 4D:
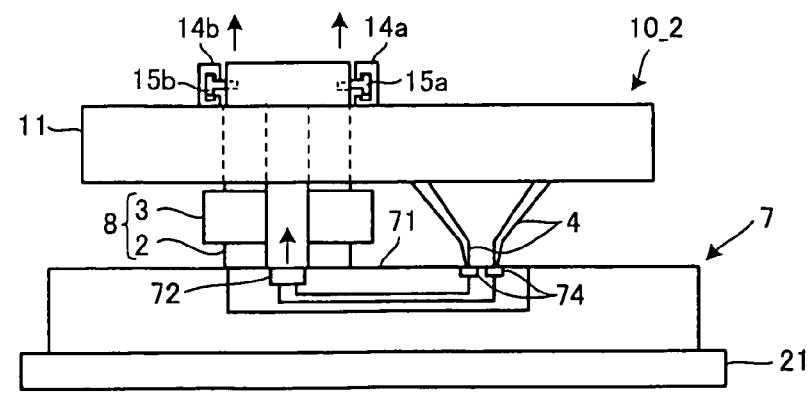
Figure 5:
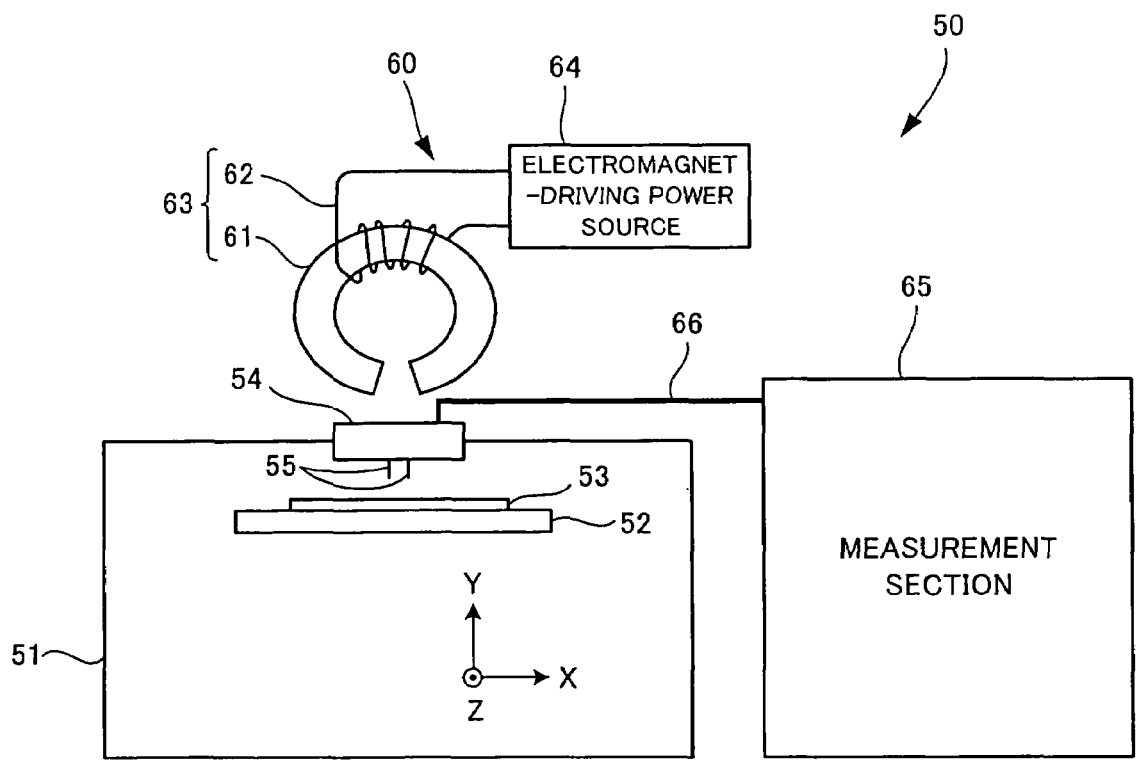
FIG. 5 is a view illustrating the configuration of a test apparatus, as an example of a conventional apparatus, with which characteristics of a magnetic sensor on a semiconductor device are tested.

FIG. 3 is a view illustrating the configuration of a test apparatus in which a probe card as the second embodiment of the present invention is employed.

In a base 11_2 of a probe card 10_2 as the second embodiment, support sections 14a and 14b are provided that support the electromagnet 8 in such a way that the electromagnet 8 can move vertically. Members 15a and 15b are provided at the top portions of both sides of the iron core 2 that is a constituent component of the electromagnet 8. The member 15a is supported by the support section 14a, in such a way as to be movable vertically. Similarly, the member 15b is supported by the support section 14b, in such a way as to be movable vertically.

Parts (a) to (d) of FIG. 4 are sectional views for explaining the supporting mechanism of the supporting section 14a and 14b of the probe card 10_2 as the second embodiment of the present invention.

Part (a) of FIG. 4 is a view illustrating a state in which the probe card 10_2 and the wafer 7 are apart from each other.

Part (b) of FIG. 4 is a view illustrating a state in which, after the rise of the wafer platform 21, the electromagnet 8 and the probe pins 4 that are provided in the probe card 10_2 are in contact with the wafer 7.

Part (c) of FIG. 4 is a view illustrating a state in which, after the rise of the wafer platform 21, the wafer 7 is in contact with the electromagnet 8, in the case where the probe pins 4 have worn. In this situation, in the case where the wear of the front edges of the probe pins 4 has occurred, the wafer platform 21 rises, the electromagnet 8 contacts the wafer 7, prior to the probe pins 4. As illustrated in part (c) of FIG. 4, at the time when the electromagnet 8 contacts the wafer 7, the distance between the probe pins 4 and the wafer 7 is "a".

Part (d) of FIG. 4 is a view illustrating a state in which the electromagnet 8 is raised by the distance "a" from the wafer platform 21, to the extent that the probe pins 4 come into contact with the wafer 7.

With the configuration described above, the electromagnet 8 is raised by the wafer 7; therefore, the breakage of the chip 71 can be avoided.

Thereafter, the magnetic-sensor terminals 74 electrically contact the corresponding probe pins 4 of the probe card 10_2, and the electromagnet 8 applies a magnetic field to the magnetic-field sensing section 72. In the magnetic-field sensing section 72, electromotive force is created, whereby the output current flows through the conducting wires 73 and is sensed through the probe pins 4.

As described heretofore, even in the case where the wear of the probe pins occurs, the distance between the gap section of the electromagnet and the magnetic-field sensing section is always constant, whereby the intensity of the magnetic field is also kept constant.

As explained heretofore, the present invention can provide a probe card in which cost reduction is realized, and contrivance of accurately applying to the magnetic-field sensing section a local magnetic field or a high-frequency magnetic field is employed.

What is claimed is:

1. A probe card comprising:
a probe pin that is used in a test apparatus for testing characteristics of a magnetic sensor in each of chips arranged on a wafer, each magnetic sensor, which has a magnetic-field sensing section that receives magnetic force and creates an output corresponding to the magnetic force and a magnetic-sensor terminal that enables external sensing of the output created in the magnetic-field sensing section, being formed in the chip, and that contacts the magnetic-sensor terminal in each chip, and senses the output outputted to the magnetic-sensor terminal,
wherein the probe card includes a base that supports the probe pin, and supports an electromagnet that applies magnetic force to the magnetic-field sensing section in one of the chips, when the probe pin contacts the magnetic-sensor terminal in the one of the chips.

2. The probe card according to claim 1, wherein the electromagnet is vertically movably supported by the base so that the electromagnet can be raised by the wafer until the probe pin can contact the magnetic-sensor terminal.

3. A probe card comprising:
a probe pin for testing characteristics of a magnetic sensor in each of chips arranged on a wafer, each magnetic sensor, which has a magnetic-field sensing section that receives magnetic force and creates an output corresponding to the magnetic force and a magnetic-sensor terminal that enables external sensing of the output created in the magnetic-field sensing section, being formed in the chip, which probe pin contacts the magnetic-sensor terminal in each chip, and senses the output outputted to the magnetic-sensor terminal, the probe card including:

a base that supports the probe pin; and an electromagnet that, when the probe pin supported by the base contacts the magnetic-sensor terminal in one of the chips on the wafer, applies magnetic force to the magnetic-field sensing section in the one of the chips, wherein the electromagnet is vertically movably supported by the base and vertically moved by the wafer to allow the probe pin to come in contact with the magnetic-sensor terminal.

* * * * *

UNITED STATES PATENT AND TRADEMARK OFFICE
CERTIFICATE OF CORRECTION

PATENT NO.         : 7,183,763 B1
APPLICATION NO. : 11/374023
DATED              : February 27, 2007
INVENTOR(S)        : Hisanori Murata It is certified that error appears in the above-identified patent and that said Letters Patent is hereby corrected as shown below:

On the Title Page, item 57 in the Abstract section, line 3, after "terminal" delete "in" and line 4, change "chips" to --chip--.

Signed and Sealed this

Twelfth Day of June, 2007

JON W. DUDAS
*Director of the United States Patent and Trademark Office*